United States Patent [19]

Ohsawa

[11] Patent Number: 5,751,639
[45] Date of Patent: May 12, 1998

[54] DRAM HAVING A POWER SUPPLY VOLTAGE LOWERING CIRCUIT

[75] Inventor: Takashi Ohsawa, Yokohama, Japan

[73] Assignee: Kabushiki Kaisha Toshiba, Kawasaki, Japan

[21] Appl. No.: 588,930

[22] Filed: Jan. 19, 1996

[30] Foreign Application Priority Data

Jan. 20, 1995 [JP] Japan .................................. 7-007150

[51] Int. Cl.$^6$ .................................................. H01L 21/00
[52] U.S. Cl. ............................ 365/226; 323/313; 365/227
[58] Field of Search ............................. 365/226, 227, 365/228

[56] References Cited

U.S. PATENT DOCUMENTS

| 5,539,771 | 7/1996 | Noda et al. | 375/219 |
| 5,559,425 | 9/1996 | Allman | 323/315 |

OTHER PUBLICATIONS

1986 IEEE International Solid–State Circuits Conference Digest of Technical Papers, pp. 272 and 273, Furuyama et al., "An Experimental 4Mb CMOS DRAM."

*Primary Examiner*—Viet Q. Nguyen
*Attorney, Agent, or Firm*—Banner & Witcoff, Ltd.

[57] ABSTRACT

A DRAM includes first to third voltage lowering circuits for lowering a power supply voltage supplied from the exterior and supplying the lowered voltage to an internal circuit. The first to third voltage lowering circuits are separately provided. The first voltage lowering circuit is a feedback type circuit having a P-channel MOS transistor. The first voltage lowering circuit is an exclusive circuit for creating a first potential by lowering the power supply voltage supplied from the exterior and supplying a thus created lowered power supply voltage to a $\overline{RAS}$ signal input buffer, $\overline{CAS}$ signal input buffer and $\overline{WE}$ signal input buffer. The second voltage lowering circuit is a feedback type circuit having a P-channel MOS transistor or source follower type circuit having an N-channel MOS transistor. The second voltage lowering circuit is an exclusive circuit for creating a second potential by lowering the power supply voltage supplied from the exterior and supplying a thus created lowered power supply voltage to a $V_{BL}$ generating circuit for generating a bit line precharge potential and a $V_{PL}$ generating circuit for generating a cell plate potential. The third voltage lowering circuit is a source follower type circuit having an N-channel MOS transistor. The third voltage lowering circuit is a circuit for creating a third potential by lowering the power supply voltage supplied from the exterior and supplying a thus created lowered power supply voltage to all of the other internal circuits except the above circuits.

4 Claims, 5 Drawing Sheets

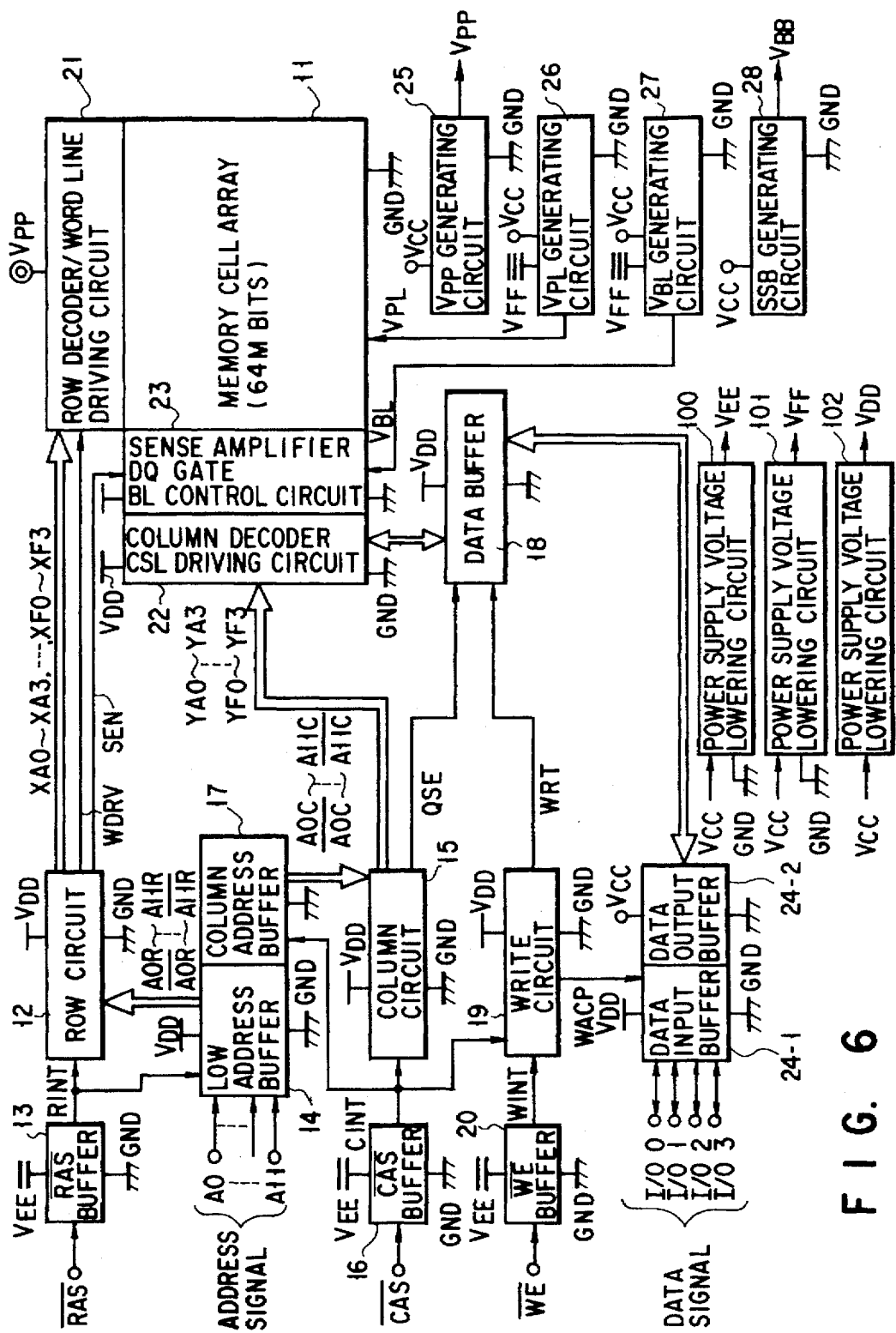
F I G. 6

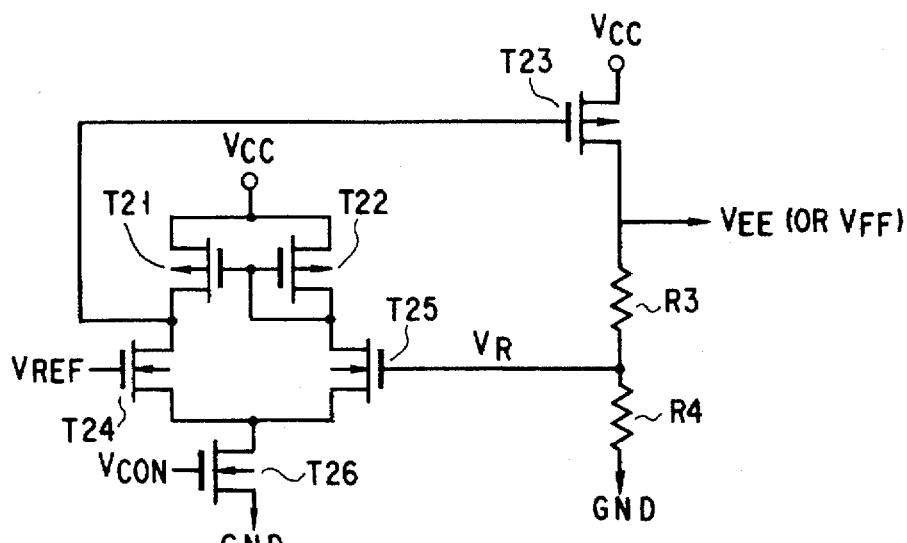
F I G. 7
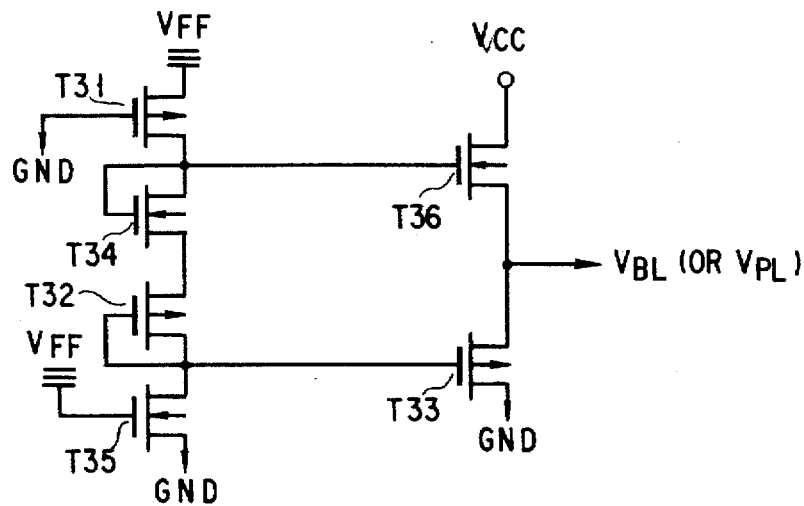
F I G. 8
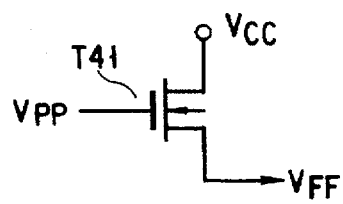
F I G. 9A
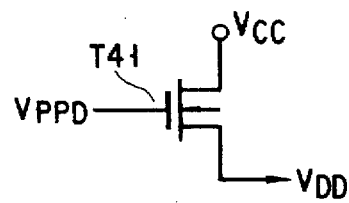
F I G. 9B

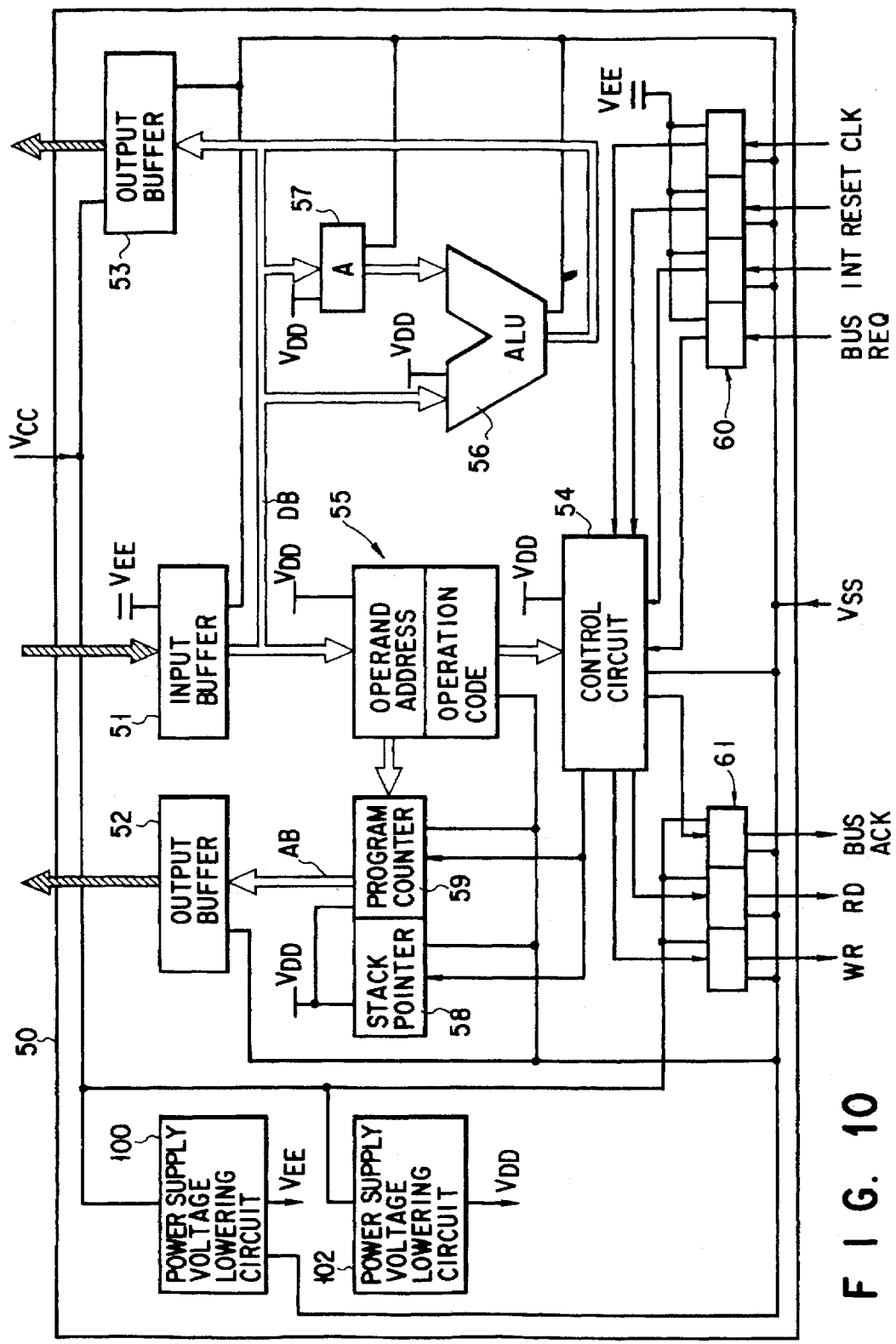
F I G. 10

DRAM HAVING A POWER SUPPLY VOLTAGE LOWERING CIRCUIT

BACKGROUND OF THE INVENTION

1. Field of the Invention

This invention relates to a semiconductor integrated circuit device having a power supply voltage lowering circuit for lowering a power supply voltage from the external and supplying the lowered voltage to an internal circuit, and is particularly suitable for a logic LSI such as a microprocessor or DRAM.

2. Description of the Related Art

In a semiconductor integrated circuit device such as a DRAM, since the withstand voltage of the gate insulative film of a MOS transistor is lowered and the resistance to hot carriers is degraded when it is further miniaturized, it becomes necessary to lower the power supply voltage. However, since the whole system must be changed in order to lower the power supply voltage itself which is supplied to the chip, it becomes a common practice to hold the voltage of the system at 5V as in the conventional case and use a voltage obtained by lowering the power supply voltage supplied from the exterior in the chip in the case of 16-Mbit DRAM.

On the other hand, in the case of 64-Mbit DRAM, the power supply voltage $V_{CC}$ for the whole system is lowered to 3.3V, but the power supply voltage lowering circuit is widely used in the chip. The reason is to make the power consumption as small as possible or enlarge the operation margin of the internal circuit and input characteristic for the power supply voltage $V_{CC}$ and is different from the demand for the 16-Mbit DRAM, but it is considered that the power supply voltage lowering circuit will be widely used not only in the DRAM but also in the semiconductor integrated circuit device.

As the conventional power supply voltage lowering circuit, a feedback type circuit including a P-channel MOS transistor as shown in FIG. 1 and a source follower type circuit including an N-channel MOS transistor as shown in FIG. 2 are known. The basic construction of the former power supply voltage lowering circuit is described in, for example, 1986 IEEE International Solid-State Circuits Conference DIGEST OF TECHNICAL PAPERS pp. 272 and 273, Furuyama et al. "An Experimental 4 Mb CMOS DRAM".

The power supply voltage lowering circuit shown in FIG. 1 creates an internal power supply voltage $V_{DD}$ by lowering a power supply voltage $V_{CC}$ supplied from the exterior and includes P-channel MOS transistors T1 to T4, N-channel MOS transistors T5 to T8, and resistors R1, R2. The sources of the MOS transistors T5 and T6 are connected together and the MOS transistors T1 and T2 which are connected in a current mirror configuration are connected between the power supply node $V_{CC}$ and the respective drains of the MOS transistors T5 and T6. The drain-source paths of the MOS transistors T7, T8 are serially connected between the source common connection node of the MOS transistors T5, T6 and the ground node GND. The drain of the MOS transistor T3 is connected to the drain common connection node of the MOS transistors T2, T6 and the source thereof is connected to the power supply node $V_{CC}$. Further, the gate of the MOS transistor T4 is connected to the drain common connection node of the MOS transistors T2, T6 and the source thereof is connected to the power supply node $V_{CC}$. The resistors R1 and R2 are serially connected between the drain of the MOS transistor T4 and the ground node GND.

The gate of the MOS transistor T5 is connected to the connection node between the resistors R1 and R2 and is applied with a potential $V_R$ created by dividing an output potential $V_{DD}$.

The gate of the MOS transistor T6 is applied with a reference potential $V_{REF}$ and the gates of the MOS transistors T3, T7 are supplied with an operation control signal ACT for determining whether the power supply voltage lowering circuit should be operated or not. The operation control signal ACT is set at a high level when the power supply voltage lowering circuit is operated and is set to a low level when the operation thereof is interrupted, and when the power supply voltage lowering circuit is used in a DRAM, for example, the signal ACT is set at a high level in the operative mode and set at a low level in the standby mode. The gate of the MOS transistor T8 is supplied with a signal VCON for driving the MOS transistor T8 as a constant current source. The signal VCON is a constant potential set at an intermediate level between the power supply potential $V_{CC}$ and the ground potential GND. The internal power supply potential $V_{DD}$ obtained by lowering the power supply potential $V_{CC}$ is derived from the connection node between the drain of the MOS transistor T4 and the resistor R1.

The circuit shown in FIG. 1 keeps the output potential $V_{DD}$ at a constant level by comparing the potential $V_R$ with the reference potential $V_{REF}$ in the CMOS current mirror type comparing circuit constructed by the MOS transistors T1, T2, T5 to T8 and controlling the MOS transistor T4 according to the result of comparison. In a case where the internal power supply potential $V_{DD}$ is lower than a preset potential, that is, when $V_R<V_{REF}$, the MOS transistor T4 is set to the ON state to raise the output potential $V_{DD}$, and when $V_R>V_{REF}$, the MOS transistor T4 is set to the OFF state to lower the output potential $V_{DD}$.

FIG. 3 shows the relation between the output potential $V_{DD}$ of the power supply voltage lowering circuit and the external power supply potential $V_{CC}$. In FIG. 3, it is ideal if "$V_{DD}=V_{CC}$" when $V_{CC}<3.5$ V as indicated by a one-dot-dash line, but in practice, the driving ability of the P-channel MOS transistor T4 is not so large since the size of the P-channel MOS transistor T4 is limited (when it is made excessively large, the delay time in the feedback loop including the current mirror circuit in the case of "$V_{CC}>3.5V$" becomes too long and the operation becomes unstable) and the potential applied to the gate of the MOS transistor T4 is an output directly derived from the current mirror circuit and is not set at the GND level, and the relation of "$V_{DD}<V_{CC}$" is obtained as indicated by the solid line. Further, in the feedback type voltage lowering circuit including the P-channel MOS transistor, the feedback operation is effected and the output potential will oscillate in some condition, and therefore, fine adjustment by phase compensation, for example, is required, thereby making the circuit design difficult. In addition, since the feedback time constant is not limitlessly small, it cannot respond to a rapid variation in the internal potential and noise will be generated.

On the other hand, the power supply voltage lowering circuit of FIG. 2 is a source follower type circuit using an N-channel MOS transistor T10. An internal power supply voltage $V_{DD}$ output from the source of the voltage lowering MOS transistor T10 of N channel type is controlled to "$V_{PP}-V_{TH}$ ($V_{TH}$ is a threshold voltage of the N-channel MOS transistor T10)" by applying a high potential $V_{PP}$ to the gate of the MOS transistor T10 and applying an external power supply potential $V_{CC}$ to the drain thereof. Since the power supply voltage lowering circuit of source follower type using the N-channel MOS transistor T10 has no defects of oscillation and through current which are caused in the feedback type circuit, the MOS transistor size can be made sufficiently large, the response to the internal load is good, and the circuit characteristic is excellent. Further, by dispersedly arranging the N-channel MOS transistor T10 in the chip, degradation in the AC characteristic due to an IR drop caused by a resistance between the $V_{DD}$ generation circuit and the actual load circuit will not occur and an excellent response characteristic can be attained.

However, the power supply voltage lowering circuit of source follower type has an essential defect that the internal potential will be made significantly higher than an original preset value in a standby state in which almost no load current flows. Further, even in a state other than the standby state, if the load current becomes small, the internal potential tends to rise. Therefore, if the voltage lowering circuit is used in a DRAM, for example, the internal power supply potential has a dependency on the cycle time $t_{RC}$, that is, cycle time of $\overline{RAS}$ and it is not desirable (the internal power supply potential becomes higher as the cycle time becomes longer).

FIG. 4 shows the above state, and since the abscissa indicates the reciprocal of $t_{RC}$, "0" on the abscissa indicates the standby state. As is clearly seen from FIG. 4, the potential is set to a potential level significantly higher than an original preset value in the standby state. The above problem can be solved by providing an adequate current path so as to always pass a load current in the standby state between the output terminal of internal power supply potential $V_{DD}$ and the ground node GND. However, the current required in the standby state is set to as large as several mA since the channel width of the N-channel MOS transistor T10 acting as the voltage lowering circuit is as large as $10^4$ μm or more, and therefore, the above measure cannot be taken for the DRAM in which the standby current is required to be suppressed to 100 μA or less.

Of course, when the cycle time becomes longer, the power consumption is reduced (the power consumption varies inversely with the cycle time) and no influence is given to the electric power evaluated in the worst condition of the minimum cycle time, and therefore, a problem that the power consumption increases will not occur. Further, in a device such as a DRAM which is set into the standby state by setting a $\overline{RAS}$ signal to a high level, even if the internal power supply potential rises in the standby state and VIL-max (the maximum input signal level of an input signal which an input buffer can sense as a high level input signal) rises in the input buffer for $\overline{RAS}$ including the P-channel MOS transistors T11, T12 and N-channel MOS transistors T13 to T16 shown in FIG. 5, it is not difficult for the device to be set into the active state and no problem occurs. If the device starts to be operated in response to a $\overline{RAS}$ signal, a large current is caused to flow in the internal load so that the internal potential will be rapidly lowered to the preset potential and no problem occurs. However, the power supply voltage lowering circuit of source follower type using the N-channel MOS transistor has the following four problems (a) to (d) when it is used in a DRAM.

(a) The device is set into the standby state when $\overline{RAS}$ is set to a high level, and after a while, the internal power supply potential $V_{DD}$ starts to rise and VIHmin (the minimum input signal level of an input signal which the input buffer can sense as a high level input signal) of $\overline{RAS}$ rises. Then, the $\overline{RAS}$ buffer senses an input signal which has been sensed as a high level signal as a low level signal and the device is set into the active state. As a result, since the internal potential is lowered and VIHmin is lowered again, the input buffer senses $\overline{RAS}$ as a high level signal and is set into the standby state. Then, after a short period of time, the internal power supply potential $V_{DD}$ starts to rise and VIHmin of $\overline{RAS}$ rises. Then, it is set into the active state again. If the operation is repeatedly effected, the oscillation occurs.

(b) In a DRAM having a self-refresh mode, the standby state may be sometimes kept set for a long time in the chip while $\overline{RAS}$ is kept at a low level. At this time, the internal power supply potential $V_{DD}$ rises in some cases although $\overline{RAS}$ is set at the low level. In this case, there occurs a possibility that the self-refresh mode cannot be reset when VIHmin is raised even if $\overline{RAS}$ is set back to the high level to set the device into a mode from the self-refresh mode.

(c) For example, in a case where $\overline{RAS}$, $\overline{CAS}$ are continuously output for a long time in the active state in the normal read operation, the current consumption in the internal circuit becomes substantially "0" and the internal power supply potential $V_{DD}$ gradually rises. Then, there occurs a possibility that such a long cycle cannot be interrupted when VIHmin is raised even if $\overline{RAS}$ is raised to interrupt the long cycle.

(d) In a case where the bit line precharge potential $V_{BL}$ is created based on the internal potential by using half the internal potential of the chip, for example, the potential $V_{BL}$ also rises when the standby state is kept for a long time. In this case, since the impedance of the bit line precharge potential generating circuit is not so large, the bit line precharge potential $V_{BL}$ is kept at a level higher than the preset value for a while after the active state is set, and therefore, the readout margin of the memory cell is reduced and an error may occur.

In any case of the above problems (a) to (d), the above problem will not occur if the $\overline{RAS}$ input buffer and the bit line precharge potential generating circuit are designed to be driven by an external power supply voltage. However, if they are so designed, it makes no sense to omit the dependency of the input characteristic on the external power supply potential $V_{CC}$ and the operation margin for the external power supply potential $V_{CC}$ is reduced accordingly, thereby reducing the effect obtained by using the power supply voltage lowering circuit.

The conventional semiconductor integrated circuit device having, as described above, a power supply voltage lowering circuit of feedback type including a P-channel MOS transistor has a problem that the output potential of the voltage lowering circuit falls below a preset value (ideal value) when a current abruptly flows through the load while the external power supply potential is low. Further, there occurs a problem that the circuit design is difficult and noise is generated. Further, the conventional semiconductor integrated circuit device having a source follower type power supply voltage lowering circuit including an N-channel MOS transistor has a problem that the internal power supply potential is raised to a level significantly higher than an original preset level in the standby state in which almost no load current flows.

SUMMARY OF THE INVENTION

Accordingly, a first object of this invention is to provide a semiconductor integrated circuit device which has a power supply voltage lowering circuit and in which the output potential of the power supply voltage lowing circuit is prevented from lowing below a preset value when a current abruptly flows through the load while the external power supply potential is low, simplifying the design and suppressing generation of noise.

A second object of this invention is to provide a semiconductor integrated circuit device capable of solving a problem caused when the internal power supply potential rises in the standby state.

A third object of this invention is to provide a semiconductor memory device which has a power supply voltage lowering circuit and in which the output potential of the power supply voltage lowing circuit is prevented from lowing below a preset value when a current abruptly flows through the load while the external power supply potential is low, simplifying the design and suppressing generation of noise.

A fourth object of this invention is to provide a semiconductor memory device capable of solving a problem caused when the internal power supply potential rises in the standby state.

A fifth object of this invention is to provide a microprocessor which has a power supply voltage lowering circuit and in which the output potential of the power supply voltage lowing circuit is prevented from lowing below a preset value when a current abruptly flows through the load while the external power supply potential is low, simplifying the design and suppressing generation of noise.

A sixth object of this invention is to provide a microprocessor capable of solving a problem caused when the internal power supply potential rises in the standby state.

The first and second objects of this invention can be attained by a semiconductor integrated circuit device comprising a first voltage lowering circuit of source follower type having an N-channel MOS transistor for lowering a power supply voltage supplied from the exterior and supplying the lowered voltage to at least part of an internal circuit as a power supply voltage thereof; an inverter type input buffer; and a second voltage lowering circuit of feedback type having a P-channel MOS transistor exclusively used for supplying a potential created by lowering the power supply voltage supplied from the exterior to the inverter type input buffer as a power supply voltage thereof.

With the above construction, since the feedback type voltage lowering circuit having the P-channel MOS transistor exclusively used for the inverter type input buffer in which a load current is extremely small is used, the stable operation can be realized without exhibiting the defect of the feedback type voltage lowering circuit. Therefore, a semiconductor integrated circuit device can be provided in which the output potential of the power supply lowering circuit is prevented from lowering below a preset value when a current abruptly flows through the load while the external power supply potential is low, the design can be made simple, and generation of noise can be suppressed. Further, since the source follower type voltage lowering circuit having the N-channel MOS transistor is not used for the inverter type input buffer, a semiconductor integrated circuit device can be provided in which a problem occurring when the internal power supply potential rises in the standby state can be avoided The third and fourth objects of this invention can be attained by a semiconductor memory device comprising a dynamic memory cell array; a row circuit for selecting a row of the memory cell array; a column circuit for selecting a column of the memory cell array; a write circuit for writing data into the memory cell array; a $\overline{RAS}$ buffer for supplying an input $\overline{RAS}$ signal to the row circuit; a $\overline{CAS}$ buffer for supplying an input $\overline{CAS}$ signal to the column circuit; a $\overline{WE}$ buffer for supplying an input $\overline{WE}$ signal to the write circuit; a first voltage lowering circuit of feedback type having a P-channel MOS transistor exclusively used for supplying a potential created by lowering the power supply voltage supplied from the exterior to at least one of the $\overline{RAS}$ buffer, $\overline{CAS}$ buffer and $\overline{WE}$ buffer as the power supply voltage thereof; a bit line precharge potential generating circuit for generating a precharge potential of bit lines of the memory cell array; a memory cell plate potential generating circuit for generating a plate potential of memory cells of the memory cell array; and a second voltage lowering circuit of feedback type having a P-channel MOS transistor exclusively used for supplying a potential created by lowering the power supply voltage supplied from the exterior to part of at least one of the bit line precharge potential generating circuit and the memory cell plate potential generating circuit as a power supply voltage thereof.

With the above construction, since the first exclusive voltage lowering circuit of feedback type having the P-channel MOS transistor is used for at least one of the $\overline{RAS}$ buffer, $\overline{CAS}$ buffer and $\overline{WE}$ buffer in which a load current is extremely small and the second exclusive voltage lowering circuit of feedback type having the P-channel MOS transistor is provided for part of at least one of the bit line precharge potential generating circuit and the memory cell plate potential generating circuit, the stable operation can be realized without exhibiting the defect of the feedback type voltage lowering circuit. Therefore, a semiconductor memory device can be provided in which the output potential of the power supply lowering circuit is prevented from lowering below a preset value when a current abruptly flows through the load while the external power supply potential is low, the design can be made simple, and generation of noise can be suppressed. Further, since the source follower type voltage lowering circuit having the N-channel MOS transistor is not used for the $\overline{RAS}$ buffer, $\overline{CAS}$ buffer, $\overline{WE}$ buffer, bit line precharge potential generating circuit and memory cell plate potential generating circuit, a semiconductor memory device can be provided in which a problem occurring when the internal power supply potential rises in the standby state can be avoided.

Further, the fifth and sixth objects of this invention can be attained by a microprocessor comprising a first input buffer of inverter type to which data and an instruction are input; an instruction register for storing an instruction input to the first input buffer; a program counter to which an operand address of an instruction input to the instruction register is input; a first output buffer operated on a power supply voltage supplied from the exterior, for receiving a memory address output from the program counter via an address bus and outputting the memory address to the exterior; a stack pointer for specifying a stack on the memory; a second input buffer for receiving a timing signal input from the exterior; a second output buffer operated on a power supply voltage supplied from the exterior, for outputting the timing signal to the exterior; a control circuit supplied with an operation code of an instruction input to the instruction register and a timing signal input to the second input buffer, for controlling the program counter and stack pointer and outputting the timing signal to the second output buffer; an ALU for receiving data input to the first input buffer via a data bus at one input terminal thereof and outputting the result of operation to the data bus; an accumulator for accumulating data input from the address bus and supplying accumulated data to the other input terminal of the ALU; a third output buffer operated on a power supply voltage supplied from the exterior, for outputting data on the data bus to the exterior;

a first voltage lowering circuit of feedback type having a P-channel MOS transistor exclusively used for supplying a potential created by lowering the power supply voltage supplied from the exterior to the first and second input buffers as power supply voltages thereof; and a second voltage lowering circuit of source follower type having an N-channel MOS transistor exclusively used for supplying a potential created by lowering the power supply voltage supplied from the exterior to the instruction register, control circuit, program counter, stack pointer, ALU and accumulator as power supply voltages thereof.

In the above microprocessor, since a large current is not required in the first and second input buffers even in the active state, the exclusive voltage lowering circuit of feedback type in which the stability in the feedback loop can be attained and the high level stability can be attained in the standby mode is used. Since the first to third output buffers require a large current, they are operated on a power supply voltage supplied from the exterior. Further, in the other internal circuits, that is, the control circuit, instruction register, ALU, accumulator, stack pointer and program counter, the second voltage lowering circuit of source follower type having the exclusive N-channel MOS transistor in which an adequate amount of current flows and the operation is stable is used. As a result, a microprocessor can be provided in which the output potential of the power supply lowering circuit is prevented from lowering below a preset value when a current abruptly flows through the load while the external power supply potential is low, the design can be made simple, and generation of noise can be suppressed. Further, since the voltage lowering circuit of source follower type having the N-channel MOS transistor is not used for the input buffer, a microprocessor in which a problem caused when the internal power supply potential rises in the standby state can be avoided can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a block diagram showing the schematic construction when this invention is applied to a DRAM, for explaining a semiconductor integrated circuit device according to a first embodiment of this invention;

FIG. 7 is a circuit diagram showing an example of the construction of an exclusive voltage lowering circuit used for a $\overline{RAS}$ buffer, $\overline{CAS}$ buffer and $\overline{WE}$ buffer in the circuit shown in FIG. 6 or an exclusive voltage lowering circuit used for a cell plate potential generating circuit and bit line precharge potential generating circuit;

FIG. 8 is a circuit diagram showing an example of the construction of the bit line precharge potential generating circuit or cell plate potential generating circuit in the circuit shown in FIG. 6;

FIGS. 9A and 9B are circuit diagrams showing examples of other constructions of a power supply voltage lowering circuit for power supply voltage $V_{FF}$ used in the bit line precharge potential generating circuit and cell plate potential generating circuit in the circuit shown in FIG. 6; and FIG. 10 is a block diagram showing a circuit section relating to this invention in a simplified form and indicating a microprocessor as one example of a logic LSI, for explaining a semiconductor integrated circuit device according to a second embodiment of this invention.

DETAILED DESCRIPTION OF THE PREFERRED EMBODIMENTS

Figure 1:
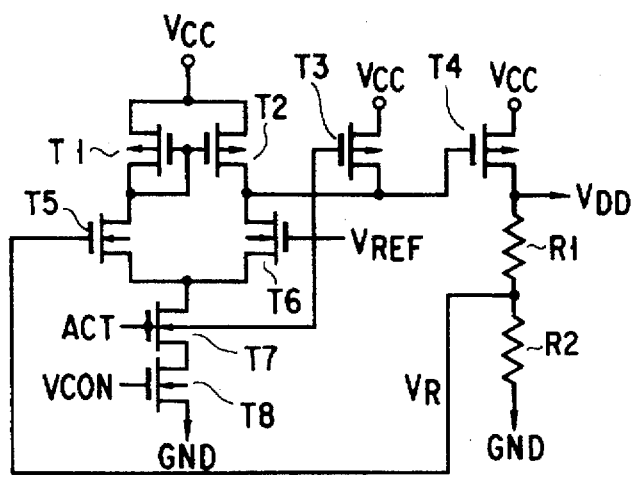
FIG. 1 is a circuit diagram showing an example of the construction of a conventional feedback type voltage lowering circuit having a P-channel MOS transistor.
Figure 2:
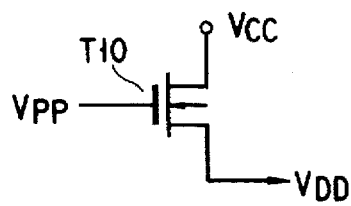
FIG. 2 is a circuit diagram showing an example of the construction of a conventional source follower type voltage lowering circuit having an N-channel MOS transistor.
Figure 3:
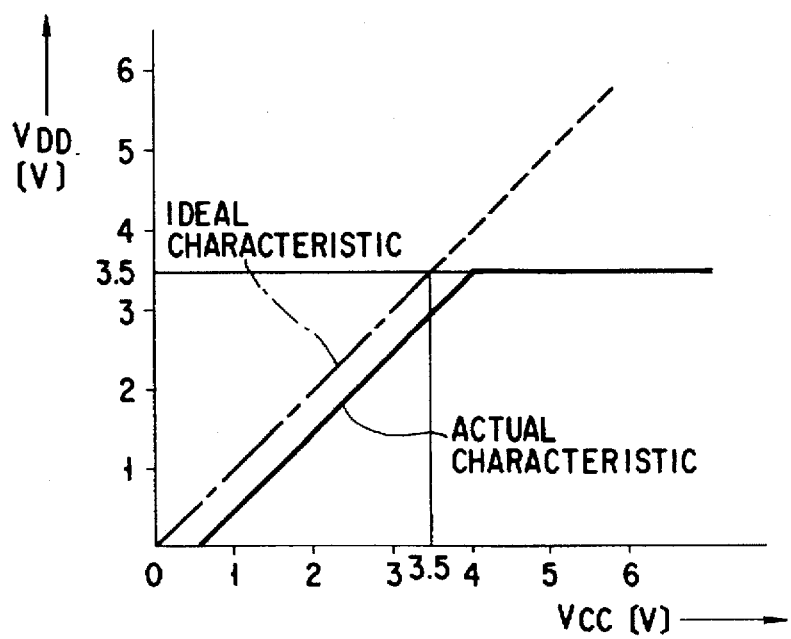
FIG. 3 is a characteristic diagram showing the relation between the output potential of the power supply voltage lowering circuit shown in FIG. 1 and the external power supply potential.

FIG. 6 is a block diagram showing the schematic construction of a DRAM to which this invention is applied, for explaining a semiconductor integrated circuit device according to a first embodiment of this invention.

Memory cells are arranged in rows and columns in a 64-Mbit memory cell array 11. An input buffer ($\overline{RAS}$ buffer) 13 receives a $\overline{RAS}$ (row address strobe) signal and outputs an internal $\overline{RAS}$ signal RINT. The $\overline{RAS}$ buffer 13 is operated on a voltage between a power supply $V_{EE}$ and GND. A row address buffer 14 and column address buffer 17 receive an address signal (A0 to A11), the row address buffer 14 outputs a row address signal (A0R to A11R) and an inverted signal ($\overline{A0R}$ to $\overline{A11R}$) thereof and the column address buffer 17 outputs a column address signal (A0C to A11C) and an inverted signal ($\overline{A0C}$ to $\overline{A11C}$) thereof. The row address buffer 14 and column address buffer 17 are operated on a voltage between a power supply $V_{DD}$ and GND. A row circuit 12 receives an internal $\overline{RAS}$ signal RINT output from the $\overline{RAS}$ buffer 13 and a row address signal (A0R to A11R) and an inverted signal ($\overline{A0R}$ to $\overline{A11R}$) thereof output from the row address buffer 14 and creates and outputs pre-decoded row address signals (XA0 to XA3), (XB0 to XB3), (XC0 to XC3), (XD0 to XD3), (XE0 to XE3), (XF0 to XF3), word line driving signal WDRV, and sense amplifier driving signal SEN. The row circuit 12 is operated on a voltage between the power supply $V_{DD}$ and GND.

An input buffer ($\overline{CAS}$ buffer) 16 receives a $\overline{CAS}$ (column address strobe) signal and outputs an internal $\overline{CAS}$ signal CINT. The $\overline{CAS}$ buffer 16 is operated on a voltage between the power supply $V_{EE}$ and GND. A column circuit 15 receives an internal $\overline{CAS}$ signal CINT output from the $\overline{CAS}$ buffer 16 and a column address signal (A0C to A11C) and an inverted signal ($\overline{A0C}$ to $\overline{A11C}$) thereof output from the column address buffer 17 and creates and outputs pre-decoded column address signals (YA0 to YA3), (YB0 to YB3), (YC0 to YC3), (YD0 to YD3), (YE0 to YE3), (YF0 to YF3), and a driving signal QSE of a data buffer 18. The column circuit 15 is operated on a voltage between the power supply $V_{DD}$ and GND.

An input buffer ($\overline{WE}$ buffer) 20 receives a $\overline{WE}$ (write enable) signal and outputs an internal $\overline{WE}$ signal WINT. The $\overline{WE}$ buffer 20 is operated on a voltage between the power supply $V_{EE}$ and GND. A data buffer 24-1 receives a data signal (I/O0 to I/O3) supplied from the exterior and supplies the data signal to the data buffer 18, and a data buffer 24-2 receives a data signal (I/O0 to I/O3) output from the data buffer 18 and outputs the data signal to the exterior. The data buffer 24-1 is operated on a voltage between the power supply $V_{DD}$ and GND, and the data buffer 24-2 is operated on a voltage between the power supply $V_{CC}$ and GND. A write circuit 19 receives an internal $\overline{WE}$ signal output from the $\overline{WE}$ buffer 20 and respectively outputs a write signal WRT and a signal WACP to the data buffer 18 and the data input buffer 21-1 to control them. The write circuit 19 is operated on a voltage between the power supply $V_{DD}$ and GND.

A circuit block 21 contains a row decoder and a word line driving circuit and is supplied with a power supply voltage $V_{PP}$. The circuit block 21 receives and decodes pre-decoded row address signals (XA0 to XA3), (XB0 to XB3), (XC0 to XC3), (XD0 to XD3), (XE0 to XE3), (XF0 to XF3) and a word line driving signal WDRV, and selects and drives the word line of the memory cell array 11.

A circuit block 22 contains a column decoder and a CSL driving circuit and is supplied with a voltage between the power supply $V_{DD}$ and GND. The circuit block 22 receives and decodes pre-decoded column address signals (YA0 to YA3), (YB0 to YB3), (YC0 to YC3), (YD0 to YD3), (YE0 to YE3), (YF0 to YF3), and selects and drives the column selection line CSL of the memory cell array 11.

A circuit block 23 contains a sense amplifier, DQ gate and BL control circuit and is applied with a voltage between the power supply $V_{DD}$ and GND. The circuit block 23 is supplied with a sense amplifier driving signal SEN output from the row circuit 12, a bit line precharge potential $V_{BL}$ output from a $V_{BL}$ generating circuit 27, and a column selection signal output from the CSL driving circuit. The operation of the sense amplifier is controlled by the sense amplifier driving signal SEN and amplifies data on the bit line selected by the column selection signal. The DQ gate selectively transmits a potential of the bit line to the data buffer 18. The BL control circuit precharges the bit lines and equalizes the potentials thereof.

A $V_{PP}$ generating circuit 25 is operated on a voltage between the power supply $V_{CC}$ and GND and raises the power supply voltage $V_{CC}$ to create a high voltage VPP for word line driving and supplies the high voltage to the circuit block 21. A $V_{PL}$ generating circuit 26 is operated by the power supplies $V_{CC}$, $V_{FF}$ and GND, creates a cell plate potential $V_{PL}$ and applies the potential to the cell plate of the memory cell array 11. A $V_{BL}$ generating circuit 27 is operated by the power supplies $V_{CC}$, $V_{FF}$ and GND, creates a bit line precharge potential $V_{BL}$ and applies the potential to the circuit block 23. An SSB generating circuit 28 is operated by the power supplies $V_{CC}$ and GND, creates a substrate bias potential $V_{BB}$ and applies the potential to the substrate in which the DRAM is formed.

In the DRAM chip, power supply voltage lowering circuits 100, 101, 102 for lowering the power supply voltage supplied from the exterior and supplying the lowered voltages to the internal circuits are provided. The power supply voltage lowering circuit 100 is an exclusive circuit for lowering the power supply voltage $V_{CC}$ supplied from the exterior to create $V_{EE}$ and supplying the power supply voltage $V_{EE}$ to the $\overline{RAS}$ buffer 13, $\overline{CAS}$ buffer 16 and $\overline{WE}$ buffer 20. The power supply voltage lowering circuit 101 is an exclusive circuit for lowering the power supply voltage $V_{CC}$ supplied from the exterior to create $V_{FF}$ and supplying the power supply voltage $V_{FF}$ to the $V_{BL}$ generating circuit 27 and $V_{PL}$ generating circuit 26. The power supply voltage lowering circuit 102 is a circuit for lowering the power supply voltage $V_{CC}$ supplied from the exterior to create $V_{DD}$ and supplying the power supply voltage $V_{DD}$ to all of the other internal circuits except the above circuits. The power supply voltage lowering circuits 100, 101, 102 are separately provided.

Figure 5:
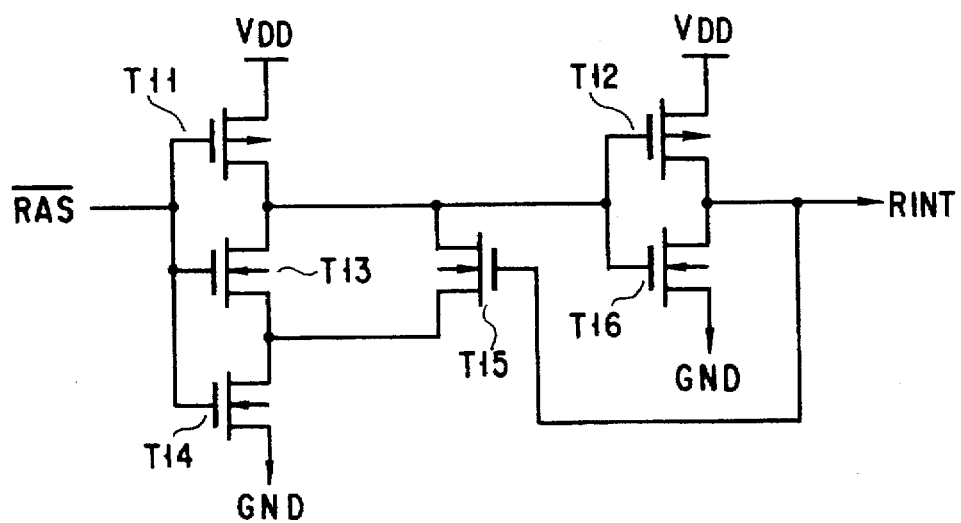
FIG. 5 is a circuit diagram showing an example of the construction of a conventional $\overline{RAS}$ buffer.

The $\overline{RAS}$ buffer 13, $\overline{CAS}$ buffer 16 and $\overline{WE}$ buffer 20 are each constructed by an inverter type input buffer which is the same as the circuit shown in FIG. 5. Further, the voltages of the respective power supplies have a relation that $V_{PP}>V_{CC}>V_{DD}=V_{EE}=V_{FF}>V_{PL}=V_{BL}>$GND, and if $V_{CC}=$3.3V, for example, $V_{PP}$ is 4V or more, $V_{DD}=V_{EE}=V_{FF}$2.8V, $V_{PL}=V_{BL}$=1.4V, and GND=0V.

FIG. 7 shows an example of the construction of the power supply voltage lowering circuit 100 exclusively used for the $\overline{RAS}$ buffer 13, $\overline{CAS}$ buffer 16 and $\overline{WE}$ buffer 20 shown in FIG. 6 and the power supply voltage lowering circuit 101 exclusively used for the $V_{PL}$ generating circuit 26 and $V_{BL}$ generating circuit 27.

The power supply voltage lowering circuit is a feedback type circuit of P-channel MOS transistor and includes P-channel MOS transistors T21 to T23, N-channel MOS transistors T24 and T25, and resistors R3, R4. The sources of the MOS transistors T24 and T25 are commonly connected, and the MOS transistors T21, T22 of current mirror configuration are connected between the drain thereof and the external power supply $V_{CC}$. The drain of the MOS transistor T26 is connected to the source common connection node of the MOS transistors T24, T25, the drain thereof is connected to the ground node GND, and the gate thereof is supplied with a signal VCON for operating the MOS transistor T26 as a constant current source. The signal VCON is a constant potential set at an intermediate level between the power supply potential $V_{CC}$ and the ground potential GND. The source of the MOS transistor T23 is connected to the power supply $V_{CC}$, and the gate thereof is connected to the drain common connection node of the MOS transistors T21, T24. The resistors R3, R4 are serially connected between the drain of the MOS transistor T23 and the ground node GND. The connection node between the resistors R3 and R4 is connected to the gate of the MOS transistor T25. A reference potential $V_{REF}$ is applied to the gate of the MOS transistor T24 and an internal power supply potential $V_{EE}$ (or $V_{FF}$) obtained by lowering the external power supply potential $V_{CC}$ is derived from the connection node between the drain of the MOS transistor T23 and the resistor R3.

With the above construction, a CMOS current mirror type comparing circuit constructed by the MOS transistors T21, T22, T24, T25, T26 compares a potential $V_R$ at the connection node between the resistors R3 and R4 with the reference potential $V_{REF}$ and keeps the output potential $V_{EE}$ (or $V_{FF}$) constant by controlling the MOS transistor T23 based on the result of comparison, and in a case where the output potential is lower than a preset potential, that is, when "$V_R<V_{REF}$", the P-channel MOS transistor T23 is set to the ON state to raise the output potential $V_{EE}$ (or $V_{FF}$), and when "$V_R>V_{REF}$", the MOS transistor T23 is set to the OFF state to lower the output potential.

The power supply voltage lowering circuit is a feedback type voltage lowering circuit having a P-channel MOS transistor and the extremely stable operation can be attained without exhibiting the defect described before in a case where it is used in at least part of the $\overline{\text{RAS}}$ buffer 13, $\overline{\text{CAS}}$ buffer 16, $\overline{\text{WE}}$ buffer 20, $V_{BL}$ generating circuit 27 and $V_{PL}$ generating circuit 26 in which a load current is extremely small.

FIG. 8 shows an example of the construction of the $V_{BL}$ generating circuit 27 or $V_{PL}$ generating circuit 26 in the circuit shown in FIG. 6. The circuit includes P-channel MOS transistors T31 to T33 and N-channel MOS transistors T34 to T36. The current paths of the MOS transistors T31, T34, T32, T35 are serially connected between the internal power supply $V_{FF}$ and the ground node GND. The gate of the MOS transistor T31 is connected to the ground node GND, and the gate of the MOS transistor T34 is connected to the common connection node between the drains of the MOS transistors T34 and T31. The gate of the MOS transistor T35 is connected to the internal power supply $V_{FF}$, and the gate of the MOS transistor T32 is connected to the common connection node between the drains of the MOS transistors T32 and T35. The drain of the MOS transistor T36 is connected to the external power supply $V_{CC}$, and the gate thereof is connected to the common connection node between the drains of the MOS transistors T31 and T34. The drain of the MOS transistor T33 is connected to the ground node GND, the gate thereof is connected to the common connection node between the drains of the MOS transistors T32 and T35, and the source thereof is connected to the source of the MOS transistor T36. An output potential $V_{BL}$ or $V_{PL}$ is derived from the source common connection node of the MOS transistors T36 and T33.

In the circuit of FIG. 8, when an output level is lowered, the ON resistance of the MOS transistor T36 is lowered to raise the level of the output potential $V_{BL}$ or $V_{PL}$, and when an output level rises, the ON resistance of the MOS transistor T33 is lowered to lower the level of the output potential $V_{BL}$ or $V_{PL}$. As a result, the output level can be kept at a constant level. Further, since the internal power supply $V_{EE}$ is used in the bias stage of the $V_{BL}$ generating circuit 27 and the external power supply $V_{CC}$ is used in the output stage thereof which requires a large current, a large current driving ability can be attained while suppressing the power consumption.

FIG. 9A shows another example of the construction of a power supply voltage lowering circuit for the power supply $V_{FF}$ used in the $V_{BL}$ generating circuit 27 and $V_{PL}$ generating circuit 26 in the circuit shown in FIG. 6. The $V_{BL}$ ($V_{PL}$) generating circuit shown in FIG. 8 is divided into two portions for the bias stage and output stage, and the internal power supply $V_{FF}$ is used only for the bias stage and has a function of setting the output potential $V_{BL}$ ($V_{PL}$) to an intermediate level between the internal power supply $V_{FF}$ and the ground potential GND. However, a load current flowing in the bias stage is minute (approx. several μA) and kept at a constant value. Therefore, as the power supply voltage lowering circuit exclusively used for the internal power supply $V_{FF}$, a source follower type circuit having an N-channel MOS transistor as shown in FIG. 9A can be used. That is, the drain of an N-channel MOS transistor T41 is connected to the external power supply $V_{CC}$, and the gate thereof is applied with a high potential $V_{PP}$ created by raising the external power supply voltage $V_{CC}$ by use of the $V_{PP}$ generating circuit 25. The internal power supply voltage $V_{FF}$ is derived from the source of the MOS transistor T41.

The gate potential $V_{PP}$ of the voltage lowering circuit shown in FIG. 9A is not necessarily set equal to the raised potential $V_{PP}$ for word line driving, and it is possible to use a voltage raising circuit exclusively used for the gate potential of the voltage lowering circuit to generate an exclusive potential $V_{PPD}$ and provide a construction as shown in FIG. 9B. With the construction of FIG. 9B, an advantage that the word line potential and the power supply potential $V_{DD}$ for the peripheral circuit can be independently set can be obtained. Further, the voltage raising circuit exclusively used for $V_{PPD}$ can be formed of a small circuit since the load current is small.

However, since the load currents of the input stages such as $\overline{\text{RAS}}$ buffer 13, $\overline{\text{CAS}}$ buffer 16 and $\overline{\text{WE}}$ buffer 20 vary according to an input signal (in the range of three to four digits from several μA to several mA), the level of the output potential $V_{EE}$ varies and the characteristic is degraded if the voltage lowering circuit of source follower type having an N-channel MOS transistor is used, and therefore, the circuit cannot be used.

Figure 4:
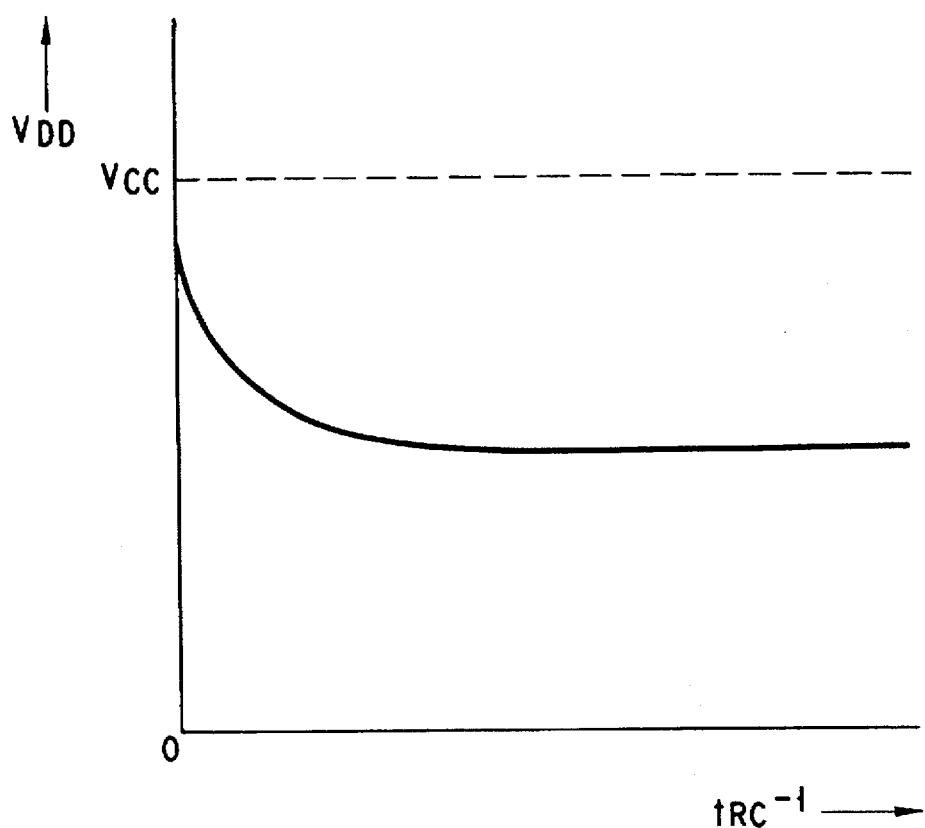
FIG. 4 is a diagram showing the dependency of the internal power supply potential on the cycle time when the power supply voltage lowering circuit shown in FIG. 2 is used for a DRAM.

As described above, in the first embodiment of this invention, the peripheral circuit other than the $\overline{\text{RAS}}$ buffer 13, $\overline{\text{CAS}}$ buffer 16, $\overline{\text{WE}}$ buffer 20, $V_{BL}$ generating circuit 27 and $V_{PL}$ generating circuit 26 in the DRAM with the construction shown in FIG. 6 is driven by the output potential $V_{DD}$ of the voltage lowering circuit having a large-sized N-channel MOS transistor as in the conventional case. For this reason, the internal power supply potential $V_{DD}$ rises to a level higher than the preset potential in the standby state as shown in FIG. 4, but since a large load current flows when the $\overline{\text{RAS}}$ buffer 13 is operated and the DRAM starts to be operated, the power supply potential $V_{DD}$ in the chip immediately returns to the preset level. Therefore, a problem that the power consumption increases and the operation timings in the internal circuit are mismatched will not occur.

By use of the voltage lowering circuit system with the above construction, a lowered potential level which is always constant in the active state and in the standby state is generated in the chip and applied to the input buffer and memory cell driving circuit, and therefore, a problem that the threshold voltage of the input buffer is changed to cause an operation error or the readout operation for the memory cell is erroneously effected can be avoided.

The DRAM is explained as an example in the first embodiment, but this invention can be applied to another semiconductor integrated circuit device such as a logic LSI. FIG. 10 is a block diagram showing a circuit section relating to this invention in a simplified form and indicating a microprocessor as one example of the logic LSI, for explaining a semiconductor integrated circuit device according to a second embodiment of this invention.

A microprocessor 50 includes an input buffer 51, output buffers 52, 53, control circuit 54, instruction register 55, arithmetic and logic unit (ALU) 56, accumulator 57, stack pointer 58, program counter 59, input buffer 60, output buffer 61 and power supply voltage lowering circuits 100, 102.

An instruction and data are input to the input buffer 51, the instruction is supplied to the instruction register 55 and data is supplied to one input terminal of the ALU 56 and accumulator 57 via a data bus DB. The accumulator 57 stores data to be supplied to the other input terminal of the ALU 56 for operation or the result of operation of the ALU. The ALU 56 subjects input data to the necessary numerical operation or logical operation, the operation result thereof is output to the data bus, and supplied to the exterior via the output buffer 53, or supplied to and stored in the accumulator 57.

The instruction register 55 receives an instruction supplied from the input buffer 51 and temporarily stores the same to execute the instruction, and the operand address stored in the instruction register 55 is supplied to the program counter 59 and the operation code is supplied to the control circuit 54. The control circuit 54 is supplied with various timing signals from the input buffer 60 to effect the control operation so as to effect necessary operations in the CPU in a predetermined sequence. After an instruction to be executed is decoded, the control circuit 54 supplies adequate timing signals to the internal portion and external portion of the CPU via the output buffer 61 and effects the necessary operations specified by the instruction in several divided steps. Further, the control circuit 54 responds to various inputs from the exterior to the CPU and, for example, copes with an interruption request which causes the CPU to interrupt the work now executed and execute another work. The input buffer 60 is supplied with timing signals BUDREQ, INT, RESET, CLK from the exterior and supplies the timing signals to the control circuit 54. The output buffer 61 outputs timing signals WR, RD, BUSACK output from the control circuit 54 to the exterior.

The program counter 59 designates a memory address of the program which is now executed and is controlled by the control circuit 54. The memory address output from the counter 59 is supplied to a memory (not shown) via the address bus AB and output buffer 52. The stack pointer 58 specifies a stack on the memory and indicates the high-order position of a stack area in which the contents of various registers are saved at the time of execution of a sub-routine. The stack pointer 58 is controlled by the control circuit 54 and the content thereof is incremented or decremented by one each time data is "pushed" or "popped" in the stack.

The microprocessor 50 is applied with power supply voltages $V_{CC}$, $V_{SS}$ from the exterior and the power supply voltages $V_{CC}$, $V_{SS}$ are supplied to the output buffers 52, 53, 61 and the power supply voltage lowering circuits 100, 102. The power supply voltage lowering circuit 100 creates $V_{EE}$ by lowering the power supply voltage $V_{CC}$ and supplies the lowered voltage to the input buffers 51, 60 as the power supply voltage thereof, and as the circuit 100, a feedback type circuit having a P-channel MOS transistor shown in FIG. 7 is used, for example. Further, the power supply voltage lowering circuit 102 creates $V_{DD}$ by lowering the power supply voltage $V_{CC}$ and supplies the lowered voltage to the control circuit 54, instruction register 55, ALU 56, accumulator 57, stack pointer 58 and program counter 59 as the power supply voltage thereof, and as the circuit 102, a source follower type circuit having an N-channel MOS transistor shown in FIG. 9B is used, for example.

In the above microprocessor 50, since the input buffers 51, 60 do not require a large current even in the active state, the output potential $V_{EE}$ of the voltage lowering circuit of feedback type having the P-channel MOS transistor in which the stability of the feedback loop can be obtained and which has a high level stability even in the standby state is used. On the other hand, since the output buffers 52, 53, 61 require a large current, the external power supply voltages $V_{CC}$, $V_{SS}$ are used. Further, in the other internal circuit, that is, in the control circuit 54, instruction register 55, ALU 56, accumulator 57, stack pointer 58, program counter 59 and the like, the output potential $V_{DD}$ of the voltage lowering circuit of source follower type having the N-channel MOS transistor which permits an adequate current flow and has a high operation stability is used.

With the above construction, a microprocessor in which the output potential of the power supply lowering circuit is prevented from lowering below a preset value when a current abruptly flows through the load while the external power supply potential is low, the design can be made simple, and generation of noise can be suppressed can be attained. Further, a microprocessor in which a problem caused when the internal power supply voltage rises in the standby state can be avoided can be attained.

In the first and second embodiments, the DRAM and microprocessor are explained as examples, but this invention can be generally applied to a semiconductor integrated circuit device other than the DRAM and microprocessor.

Any other semiconductor integrated circuit device according to the invention comprises a circuit for setting potentials at specified nodes of the internal circuits, which is similar to the buffer and the potential generating circuit, both incorporated in the first and second embodiments. The specified nodes are those which have a delay time longer than the delay time of any internal circuit. More precisely, they have a delay time of 1 nsec or more, or a capacitance of 1 pF or more.

What is claimed is:

1. A semiconductor integrated circuit device comprising:
    an internal circuit;
    a first voltage lowering circuit being of a source follower type and having an N-channel MOS transistor, said first voltage lowering circuit for receiving an external power supply voltage, lowering the external power supply voltage to generate a first lowered voltage, and supplying the first lowered voltage to at least part of said internal circuit as a power supply voltage thereof;
    an inverter type input buffer; and
    a second voltage lowering circuit being of a feedback type and having at least one P-channel MOS transistor, said second voltage lowering circuit for receiving the external power supply voltage, lowering the external power supply voltage to generate a second lowered voltage, and supplying the second lowered voltage to said inverter type input buffer as a power supply voltage thereof.

2. A semiconductor integrated circuit device according to claim 1, wherein said second voltage lowering circuit includes
    a ground node;
    an output terminal for supplying the second lowered voltage;
    a P-channel MOS transistor having a gate, a source, and a drain, said source connected to the external power supply voltage, said drain connected to said output terminal;
    voltage dividing means for generating a divided voltage, said voltage dividing means connected between the output terminal and the ground node, the divided voltage being proportional to the second lowered voltage; and
    comparing means for comparing the divided voltage with a reference voltage, said comparing means having an output connected to said gate of said P-channel MOS transistor.

3. A semiconductor integrated circuit device according to claim 1, wherein said second voltage lowering circuit includes
    a ground node:
    an output terminal;
    a first MOS transistor of P-channel type having a source, a drain, and a gate, said source of said first MOS transistor connected to the external power supply voltage;

a second MOS transistor of P-channel type having a source, a drain, and a gate, said source of said second MOS transistor connected to the external power supply voltage and a gate connected to the gate of said first MOS transistor;

a third MOS transistor of N-channel type having a source, a drain, and a gate, said drain of said third MOS transistor connected to the drain of said first MOS transistor, said gate of said third MOS transistor connected to a reference voltage;

a fourth MOS transistor of N-channel type having a source, a drain, and a gate, said drain of said fourth MOS transistor connected to both the drain and the gate of said second MOS transistor, said source of said fourth MOS transistor connected to the source of said third MOS transistor;

a constant current source connected between the sources of said third and fourth MOS transistors and the ground node;

a fifth MOS transistor of P-channel type having a source, a drain, and a gate, said source of said fifth MOS transistor connected to the external power supply voltage, said drain of said fifth MOS transistor connected to said output terminal, and said gate of said fifth MOS transistor connected to said drains of said first and third MOS transistors; and first and second resistor elements serially connected between said output terminal and the ground node, a connection node therebetween connected to the gate of said fourth MOS transistor.

4. A semiconductor integrated device according to claim 3, wherein said constant current source includes a sixth MOS transistor of N-channel type having a drain connected to the sources of said third and fourth MOS transistors, a source connected to the ground node, and a gate applied with a voltage of intermediate level between the external power supply voltage and the ground voltage.

* * * * *